(12) United States Patent
Huang et al.

(10) Patent No.: US 9,673,182 B2
(45) Date of Patent: Jun. 6, 2017

(54) PACKAGE ON PACKAGE BONDING STRUCTURE AND METHOD FOR FORMING THE SAME

(71) Applicant: Taiwan Semiconductor Manufacturing Company, Ltd., Hsin-Chu (TW)

(72) Inventors: Kuei-Wei Huang, Hsin-Chu (TW); Wei-Yu Chen, Taipei (TW); Meng-Tse Chen, Changzhi Township (TW); Wei-Hung Lin, Xinfeng Township (TW); Ming-Da Cheng, Jhubei (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/204,844

(22) Filed: Jul. 7, 2016

(65) Prior Publication Data

US 2016/0322339 A1    Nov. 3, 2016

Related U.S. Application Data

(62) Division of application No. 14/585,534, filed on Dec. 30, 2014, now Pat. No. 9,397,062, which is a division
(Continued)

(51) Int. Cl.
*H01L 21/48* (2006.01)
*H01L 21/56* (2006.01)
(Continued)

(52) U.S. Cl.
CPC ........ *H01L 25/105* (2013.01); *H01L 21/4853* (2013.01); *H01L 21/561* (2013.01);
(Continued)

(58) Field of Classification Search
CPC ......... H01L 21/48; H01L 21/56; H01L 24/17; H01L 24/81; H01L 2224/1705; H01L 2224/81007
See application file for complete search history.

(56) References Cited

U.S. PATENT DOCUMENTS 6,011,312 A    1/2000 Nakazawa et al.
6,109,507 A    8/2000 Yagi et al.
(Continued)

FOREIGN PATENT DOCUMENTS

CN    1572129 A       1/2005
TW    530344          5/2003
TW    201110246 A1    3/2011

*Primary Examiner* — Peniel M Gumedzoe
(74) *Attorney, Agent, or Firm* — Slater Matsil, LLP

(57) ABSTRACT

A method of forming a package on package (PoP) structure includes forming a first die package, and bonding an external connector of a second die package to a solder paste layer of the first die package. The forming the first die package includes forming a contact pad over a substrate, attaching a metal ball with a convex surface to the contact pad, and applying a solder paste layer over a distal end of the metal ball and leaving at least a portion of the metal ball without solder paste. The forming the first die package also includes attaching a semiconductor die to the substrate, and forming a molding compound between the semiconductor die and the metal ball, where the solder paste layer has a first portion extending above an upper surface of the molding compound and a second portion extending below the upper surface of the molding compound.

20 Claims, 9 Drawing Sheets

Related U.S. Application Data of application No. 13/916,243, filed on Jun. 12, 2013, now Pat. No. 8,928,134.

(60) Provisional application No. 61/747,130, filed on Dec. 28, 2012.

(51) Int. Cl.
| | |
|---|---|
| *H01L 25/00* | (2006.01) |
| *H01L 25/10* | (2006.01) |
| *H01L 23/498* | (2006.01) |
| *H01L 23/538* | (2006.01) |
| *H01L 23/31* | (2006.01) |
| *H01L 23/00* | (2006.01) |
| *H01L 25/03* | (2006.01) |
| *H01L 25/065* | (2006.01) |
| *H01L 23/48* | (2006.01) |

(52) U.S. Cl.
CPC ........ *H01L 21/563* (2013.01); *H01L 23/3135* (2013.01); *H01L 23/49816* (2013.01); *H01L 23/538* (2013.01); *H01L 24/03* (2013.01); *H01L 24/05* (2013.01); *H01L 24/11* (2013.01); *H01L 24/13* (2013.01); *H01L 24/16* (2013.01); *H01L 24/17* (2013.01); *H01L 24/81* (2013.01); *H01L 24/94* (2013.01); *H01L 24/97* (2013.01); *H01L 25/03* (2013.01); *H01L 25/0657* (2013.01); *H01L 25/50* (2013.01); *H01L 23/481* (2013.01); *H01L 23/49827* (2013.01); *H01L 23/5389* (2013.01); *H01L 24/73* (2013.01); *H01L 2224/0401* (2013.01); *H01L 2224/056* (2013.01); *H01L 2224/05147* (2013.01); *H01L 2224/05557* (2013.01); *H01L 2224/05611* (2013.01); *H01L 2224/05613* (2013.01); *H01L 2224/05616* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05684* (2013.01); *H01L 2224/1132* (2013.01); *H01L 2224/11334* (2013.01); *H01L 2224/11849* (2013.01); *H01L 2224/131* (2013.01); *H01L 2224/136* (2013.01); *H01L 2224/13082* (2013.01); *H01L 2224/13147* (2013.01); *H01L 2224/13564* (2013.01); *H01L 2224/1403* (2013.01); *H01L 2224/14181* (2013.01); *H01L 2224/16058* (2013.01); *H01L 2224/16145* (2013.01); *H01L 2224/16225* (2013.01); *H01L 2224/16227* (2013.01); *H01L 2224/1705* (2013.01); *H01L 2224/32145* (2013.01); *H01L 2224/32225* (2013.01); *H01L 2224/48227* (2013.01); *H01L 2224/73204* (2013.01); *H01L 2224/73265* (2013.01); *H01L 2224/81007* (2013.01); *H01L 2224/81193* (2013.01); *H01L 2224/831* (2013.01); *H01L 2224/94* (2013.01); *H01L 2224/97* (2013.01); *H01L 2225/0651* (2013.01); *H01L 2225/06513* (2013.01); *H01L 2225/06517* (2013.01); *H01L 2225/06565* (2013.01); *H01L 2225/06568* (2013.01); *H01L 2225/1023* (2013.01); *H01L 2225/1058* (2013.01); *H01L 2225/1088* (2013.01); *H01L 2924/1305* (2013.01); *H01L 2924/1306* (2013.01); *H01L 2924/13091* (2013.01); *H01L 2924/15311* (2013.01); *H01L 2924/15331* (2013.01); *H01L 2924/181* (2013.01); *H01L 2924/18161* (2013.01)

(56) References Cited

U.S. PATENT DOCUMENTS

| | | |
|---|---|---|
| 6,333,563 B1 | 12/2001 | Jackson et al. |
| 6,337,445 B1 | 1/2002 | Abbott et al. |
| 6,781,065 B1 | 8/2004 | Palmteer |
| 7,067,911 B1 | 6/2006 | Lin et al. |
| 7,213,329 B2 | 5/2007 | Kim et al. |
| 7,262,082 B1 | 8/2007 | Lin et al. |
| 7,265,046 B2 | 9/2007 | Kondo et al. |
| 7,781,232 B2 | 8/2010 | Arvin et al. |
| 8,053,908 B2 | 11/2011 | Tanie et al. |
| 8,163,597 B2 | 4/2012 | Huang et al. |
| 8,503,186 B2 | 8/2013 | Lin et al. |
| 8,557,629 B1 * | 10/2013 | Kim .............. H01L 23/3128 257/433 |
| 9,219,030 B2 | 12/2015 | Yu et al. |
| 2002/0151164 A1 | 10/2002 | Jiang et al. |
| 2005/0121764 A1 | 6/2005 | Mallik |
| 2006/0035453 A1 | 2/2006 | Kim et al. |
| 2006/0055054 A1 | 3/2006 | Kondo et al. |
| 2008/0157329 A1 | 7/2008 | Inoue |
| 2009/0146301 A1 | 6/2009 | Shimizu |
| 2009/0146314 A1 | 6/2009 | Akaike et al. |
| 2009/0184407 A1 | 7/2009 | Arvin et al. |
| 2010/0193936 A1 | 8/2010 | Tanie et al. |
| 2010/0244216 A1 | 9/2010 | Huang et al. |
| 2010/0320622 A1 | 12/2010 | Machida |
| 2011/0024904 A1 | 2/2011 | Egawa |
| 2011/0026232 A1 | 2/2011 | Lin et al. |
| 2011/0156264 A1 | 6/2011 | Machida |
| 2011/0272807 A1 | 11/2011 | Park et al. |
| 2012/0193783 A1 * | 8/2012 | Hong .............. H01L 23/49816 257/737 |
| 2012/0319274 A1 | 12/2012 | Tanaka |
| 2013/0133936 A1 | 5/2013 | Yorita |

* cited by examiner

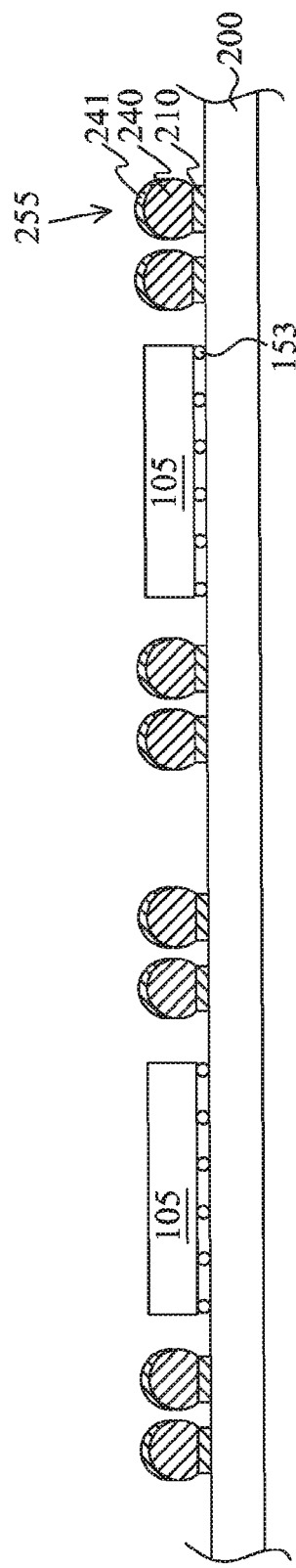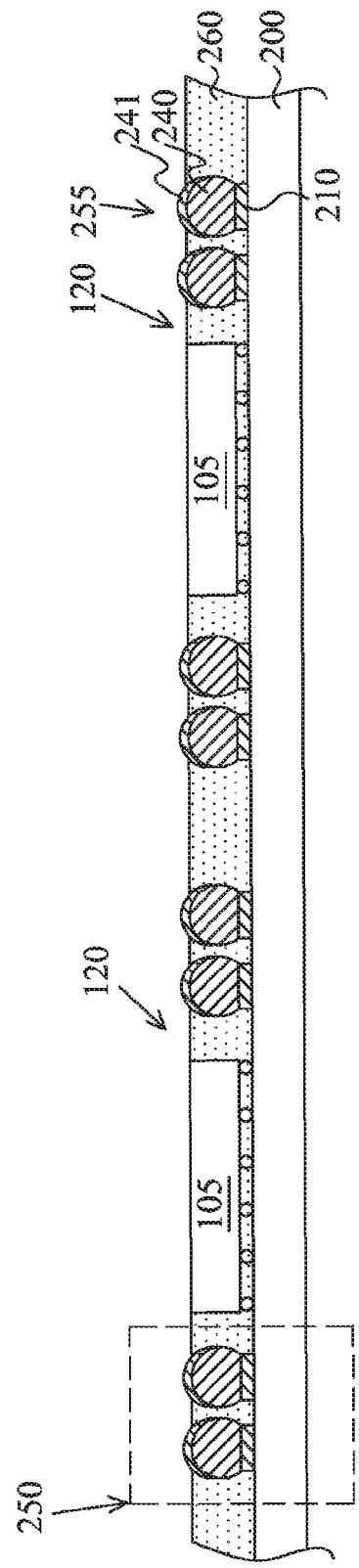

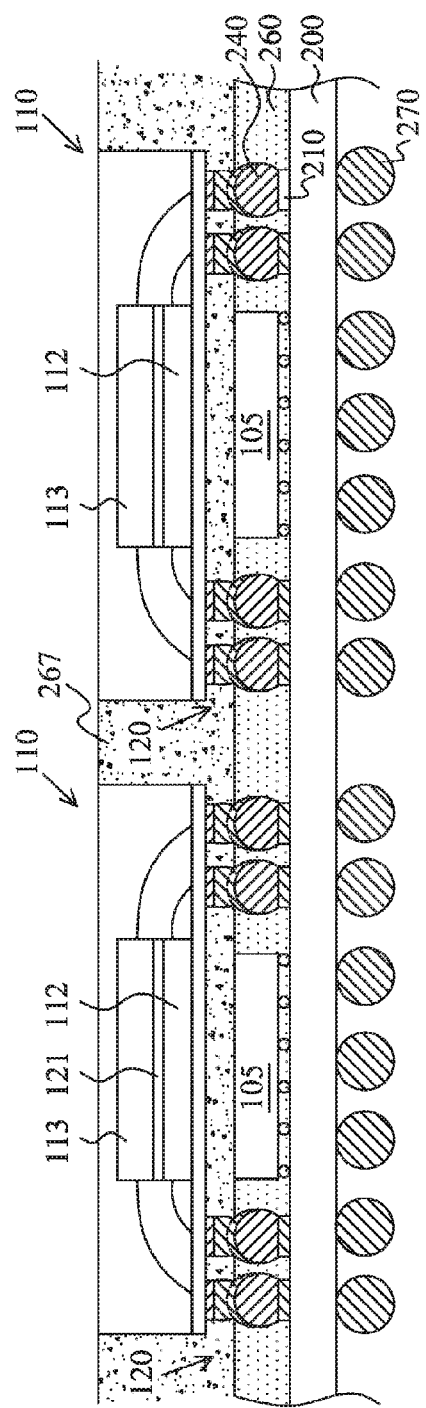
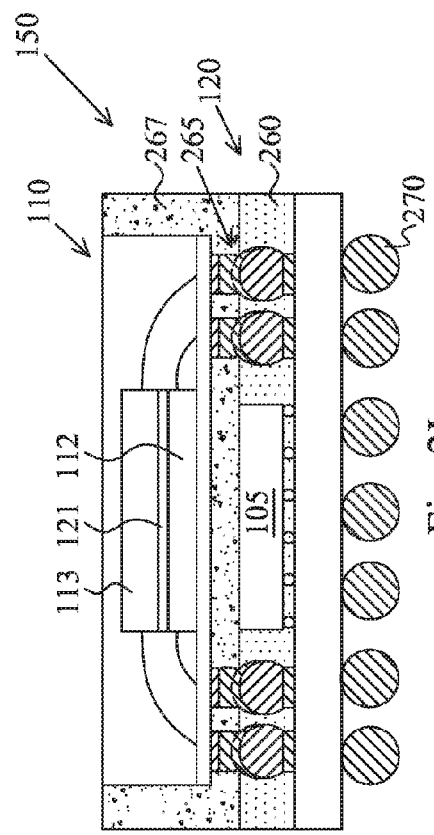
Fig. 2H
Fig. 2I

PACKAGE ON PACKAGE BONDING STRUCTURE AND METHOD FOR FORMING THE SAME

This application is a divisional of U.S. patent application Ser. No. 14/585,534, filed on Dec. 30, 2014, entitled "Package on Package Bonding Structure and Method for Forming the Same," which is a continuation of U.S. patent application Ser. No. 13/916,243, filed Jun. 12, 2013, now U.S. Pat. No. 8,928,134, issued Jan. 6, 2015, and entitled "Package on Package Bonding Structure and Method for Forming the Same," which claims priority to U.S. Provisional patent application Ser. No. 61/747,130, filed Dec. 28, 2012, which applications are incorporated by reference herein in its entirety.

This application relates to the following commonly assigned U.S. patent application Ser. No. 13/526,073, filed on Jun. 18, 2012, now U.S. Pat. No. 9,219,030, issued on Dec. 22, 2015, and entitled "Package on Package Structure and Method for Forming the Same," which is incorporated by reference herein in its entirety.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of materials over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area and/or lower height than packages of the past, in some applications.

Thus, new packaging technologies, such as package on package (PoP), have begun to be developed, in which a top package with a device die is bonded to a bottom package with another device die. By adopting the new packaging technologies, the integration levels of the packages may be increased. These relatively new types of packaging technologies for semiconductors face manufacturing challenges.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 2A-2I are cross-sectional views of a package on package (PoP) structure at various manufacturing stages, in accordance with some embodiments;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Figure 1:
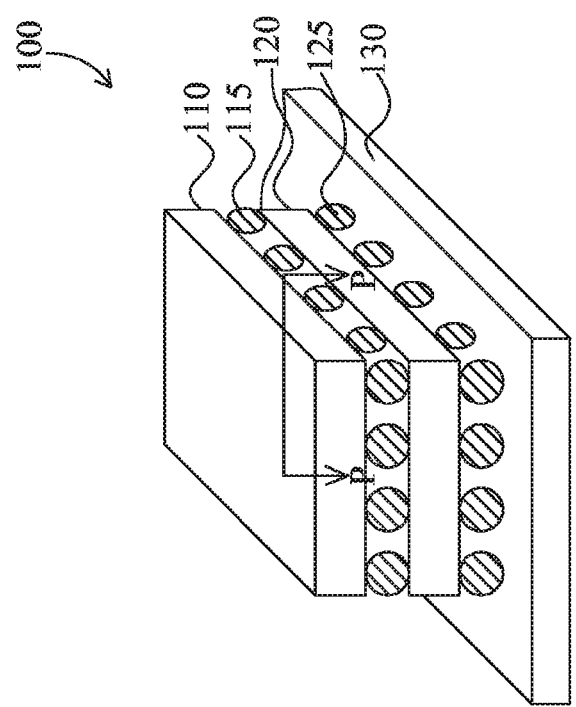
FIG. 1 shows a perspective view of a package assembly, in accordance with some embodiments.

FIG. 1 shows a perspective view of a package assembly 100 having a die package 110 bonded to another die package 120, which is further bonded to a substrate 130 in accordance with some embodiments. Each die package, such as die package 110 or die package 120, includes at least a semiconductor die (not shown). Each semiconductor die includes a substrate as employed in a semiconductor integrated circuit fabrication, and integrated circuits may be formed therein and/or thereupon. The semiconductor substrate is defined to mean any construction comprising semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used. The substrate 130 may further comprise a plurality of isolation features (not shown), such as shallow trench isolation (STI) features or local oxidation of silicon (LOCOS) features. The isolation features may define and isolate the various microelectronic elements. Examples of the various microelectronic elements that may be formed in the substrate 130 include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and other suitable processes. The microelectronic elements are interconnected to form the integrated circuit device, such as a logic device, memory device (e.g., SRAM), RF device, input/output (I/O) device, system-on-chip (SoC) device, combinations thereof, and other suitable types of devices.

Substrate 130 may be made of a semiconductor wafer, or a portion of wafer. In some embodiments, substrate 130 includes silicon, gallium arsenide, silicon on insulator ("SOI") or other similar materials. In some embodiments, substrate 130 also includes passive devices such as resistors, capacitors, inductors and the like, or active devices such as transistors. In some embodiments, substrate 130 includes additional integrated circuits. Substrates 130 may further include through substrate vias (TSVs) and may be an interposer. In addition, the substrate 130 may be made of other materials. For example, in some embodiments, substrate 130 is a multiple-layer circuit board. In some embodiments, substrate 130 also includes bismaleimide triazine (BT) resin, FR-4 (a composite material composed of woven fiberglass cloth with an epoxy resin binder that is flame resistant), ceramic, glass, plastic, tape, film, or other supporting materials that may carry the conductive pads or lands needed to receive conductive terminals.

FIG. 1 shows a die package 110 bonded to another die package 120 via bonding structures 115 and also die package 120 bonded to a substrate 130 via bonding structures 125 to form a package assembly 100, in accordance with some embodiments. The structures and formation processes of bonding structures 115 and/or 125 affect the yield and reliability of package assembly 100.

Figure 2A:
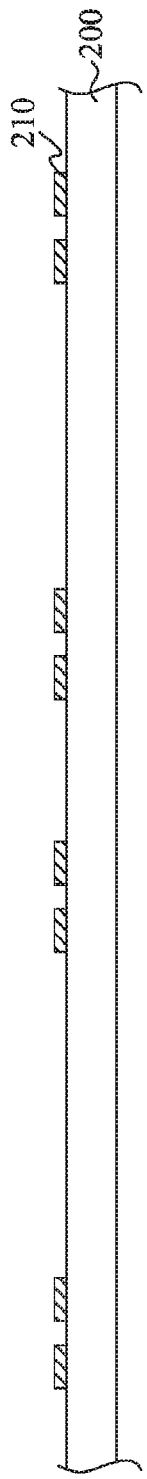

FIGS. 2A-2I are cross-sectional views of a package on package (PoP) structure of die package 110 over die package 120 at various manufacturing stages, in accordance with some embodiments. FIG. 2A shows a substrate 200 with contact pads 210 for making external connections, in accordance with some embodiments. Substrate 200 may be made of a semiconductor wafer, or a portion of a wafer. In some embodiments, substrate 200 includes silicon, gallium arsenide, silicon on insulator ("SOI") or other similar materials. In some embodiments, substrate 200 also includes passive devices such as resistors, capacitors, inductors and the like, or active devices such as transistors. In some embodiments, substrate 200 includes additional integrated circuits. Substrates 200 may further include through substrate vias (TSVs) and may be an interposer. In addition, the substrate 200 may be made of other materials. For example, in some embodiments, substrate 200 is a multiple-layer circuit board. In some embodiments, substrate 200 also includes bismaleimide triazine (BT) resin, FR-4, FR-5, which is similar to FR-4, ceramic, glass, plastic, tape, film, or other supporting materials that may carry the conductive pads or lands needed to receive conductive terminals. Contact pads 210 are made of conductive material(s) and are connected to interconnect (not shown) in substrate 200.

Figure 2B:
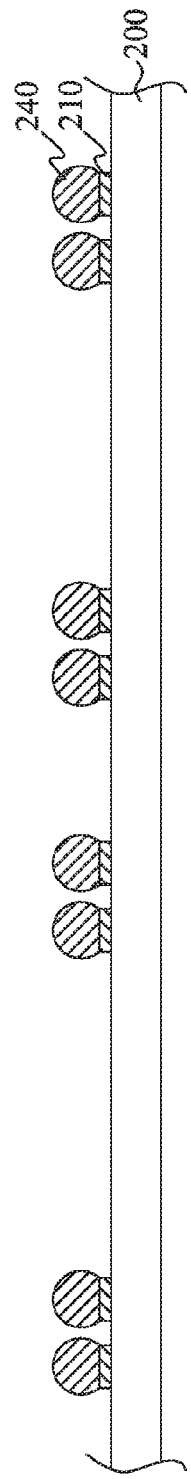

Metal balls 240 are then mounted on contact pads 210 and bond with contact pads 210, as shown in FIG. 2B in accordance with some embodiments. The mounting process may involve placing the metal balls 240 on the contact pads 210 and performing a reflow process to bond the contact metal balls 240 to contact pads 210. In some embodiments, the reflow temperature is in a range from about 180° C. to about 260° C. In some embodiments, the metal balls 240 are made of a conductive material, such as copper or copper alloy, that oxidize easily when they are exposed to air.

Figure 2C:
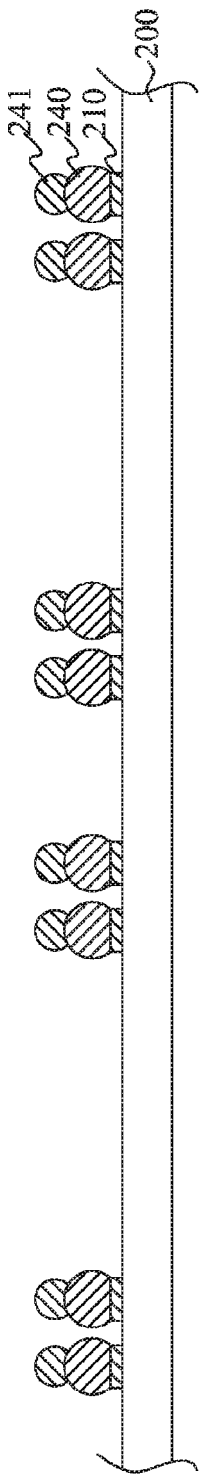

Copper oxidizes easily when exposed to air. The surface oxide layer increases resistance and degrades the bonding quality of the bonding structures between die packages, such as between die package 110 and die package 120. In order to prevent surface oxidation of metal balls 240, a solder paste layer 241 is applied on the surfaces of metal balls 240 away from contact pads 210, as shown in FIG. 2C in accordance with some embodiments. The solder paste layer 241 may also bond with solder on the external connectors of die package 120. The solder paste layer 241 is formed by a solder printing process using a solder printing apparatus, in accordance with some embodiment.

Afterwards, semiconductor dies 105 are placed on substrate 200 as shown in FIG. 2D in accordance with some embodiments. Each semiconductor die 105 is placed between bonded metal balls 240. In some embodiments, a reflow process is performed to bond the connectors (not shown) on semiconductor dies 105 to contact pads (not shown) on substrate 200 to form bonding structures 153. The bonding structures 153 connect with contact structures (not shown) on the surface of substrate 200. The reflow process changes the profile of solder paste layer 241 on metal balls 240 due to reflow temperature being near or exceeding the melting temperature of solder. The solder paste layer 241 further spreads out on (or "wets") the top surfaces of metal balls 240, as shown in FIG. 2D. Contact pads 210, bonded metal balls 240 and solder paste layer 241 form external connectors 255.

Figure 3:
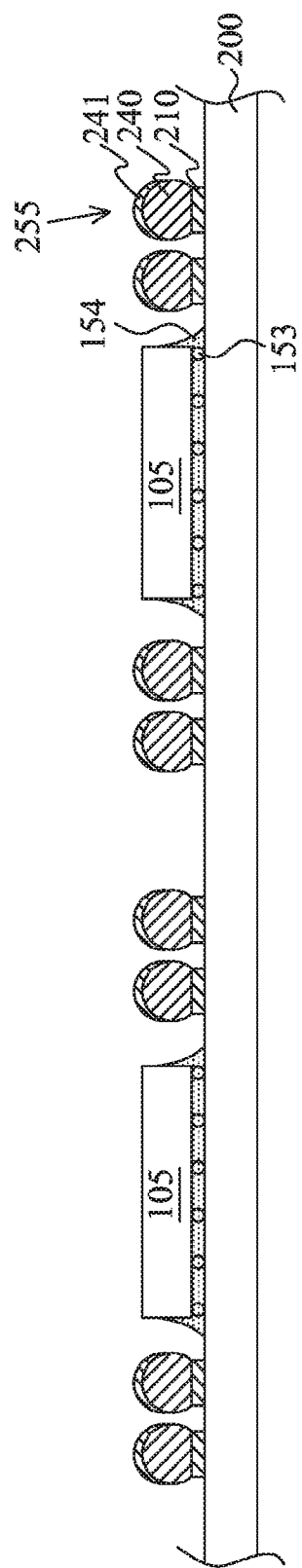
FIG. 3 shows semiconductor dies bonded to a substrate with underfill, in accordance with some embodiments.

In some embodiments, an underfill 154 fills the space between semiconductor dies 105 and substrate 200 as shown in FIG. 3. Underfill 154 provides support for semiconductor dies 105 and prevents cracking of solder joints (not shown) on bonding structures 153 electrically connecting the semiconductor dies 105 and conductive elements (interconnect) in substrate 200.

However, forming underfill 154 after semiconductor dies 105 being bonded to substrate 200 is optional. In some embodiments, underfill 154 is not formed. Underfill 154 may be made of thermosetting polymers, in accordance with some embodiments. For example, underfill 154 may be made of (or include) epoxy resin (amine type, phenol type, anhydrates types, etc.), silicon fillers, curing agents, additives and/or hardener.

Following the bonding of the semiconductor dies 105 or the optional formation of underfill 154, a molding compound 260 is formed on the surface of substrate 200 to fill the space between external connectors 255 and semiconductor dies 105. If underfill 154 is not formed to fill the space between semiconductors dies 105 and substrate 200, a molded underfill (MUF) is used as the molding compound 260 to achieve the underfill purpose. Such an implementation saves processing cost by eliminating the formation of underfill 154. FIG. 2E shows molding compound 260 fills the space between external connectors 255 and semiconductor dies 105, and also the space under semiconductor dies 105, in accordance with some embodiments. In some embodiments, the molding compound 260 has fillers. Molding compound 260 supports die packages 110 and prevents cracking of solder joints on bonding structures 153 and between metal balls 240 and contact pads 210. Further, molding compound 260 could also prevent the bending (deformation) of package on package structures on substrate 200 due to mismatch of coefficients of thermal expansion (CTE) of materials on substrate 200 after thermal cycling. In some embodiments, molding compound 260 is made of epoxy resin (amine type, phenol type, anhydrates types, etc.), silicon fillers, curing agents, additives and/or hardener materials.

Figure 4A:
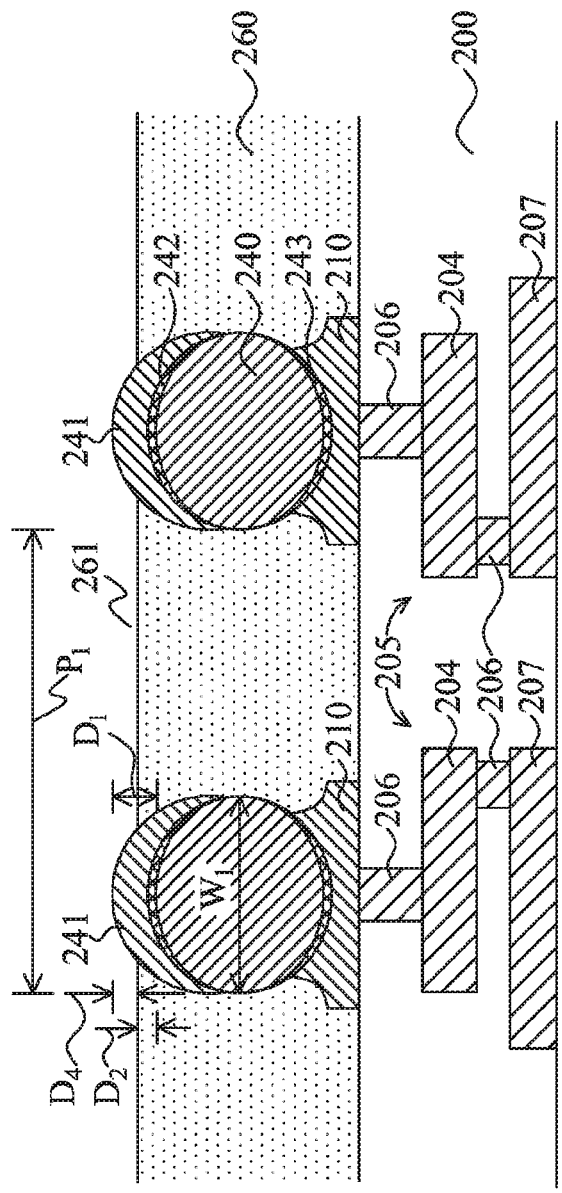
FIG. 4A is a cross-sectional view of an enlarged region of FIG. 2E, in accordance with some embodiments.

FIG. 4A is a cross-sectional view of an enlarged region 250 of FIG. 2E, in accordance with some embodiments. FIG. 4A shows region 250 includes substrate 200 and external connectors (mounted metal ball structures) 255, in accordance with some embodiments. Substrate 200 includes interconnect structures 205, which include one or more layers of metal lines 204 and vias 206. Interconnect structures 205 connect to contact pads 210, which are bonded to metal balls 240, and contact pads 207 on opposite sides of substrate 200. Interconnect structures 205 also connect with bonding structures 253 of semiconductor die 105 to enable fan-out of semiconductor die 105. In some embodiments, contact pads 210 and 207 comprise aluminum, copper, silver, gold, nickel, tungsten, alloys thereof, and/or multilayers thereof. In some embodiments, contact pads 210 are made of solder. In some embodiments, contact pads 207 are made of copper or copper alloy.

FIG. 4A shows that a portion of solder paste layer 241 being below a top surface 261 of molding compound 260.

An intermetallic compound (IMC) layer 242 is formed between solder paste layer 241 and metal balls 240, in some embodiments. In some embodiments, the thickness D1 of solder paste layer 241 is in a range from about 10 µm to about 50 µm. In some embodiments, the thickness of IMC layer 242 is in a range from about 2 µm to about 5 µm. An IMC layer 243 is formed between contact pads 210 and metal balls 240, in some embodiments. In some embodiments, the thickness of IMC layer 243 is in a range from about 3 µm to about 8 µm. In some embodiments, the metal balls 240 and the IMC layer 242 are both embedded inside the molding compound 260. In some embodiments, a distance D2 from the top of a metal ball 240 to surface 261 of molding compound 260 is in a range from about 150 µm to about 200 µm.

In some embodiments, a distance D4 from the top of the solder paste layer 241 to surface 261 of molding compound 260 is in a range from about 150 µm to about 200 µm. Having the IMC layer 242 below surface 261 make the bonding structures between external connectors 255 and connectors of die package 110 stronger than when the IMC layer is at the same level or above surface 261.

FIG. 4A shows that a portion of solder from contact pad 210 covers a surface of a lower portion of metal ball 240, which can be referred to as solder wetting. The solder wetting could occur during reflow process during mounting of metal balls 240 on contact pads 210 and/or during bonding of semiconductor die 105 to substrate 210 (or during the formation of bonding structures 153). In some embodiments, the (maximum) width W1 of the metal balls 240 is in a range from about 100 µm to about 200 µm. In some embodiments, the pitch P1 of metal balls 240 is in a range from about 150 µm to about 250 µm.

In some embodiments, a bonding layer (not shown) is formed over contact pads 210 to assist the bonding of metal balls 240 with contact pads 210. For example, if the conductive pads 210 are made of copper, the bonding layer may be made of solder, which can be used to bond copper to copper. In some embodiments, the bonding layer is made of solder or solder alloy such as Sn—Ag, Sn—Ag—Cu, Sn—Bi, Sn—Cu, etc. In some embodiments, bonding layer is made of solder alloy including Sn, Pb, Ag, Cu, Ni, bismuth (Bi), or combinations thereof. A bonding layer similar to the one described above may also be formed over contact pads 207. In some embodiments, the thickness of the bonding layer is in a range from about 0.5 µm to about 10 µm.

Figure 2F:
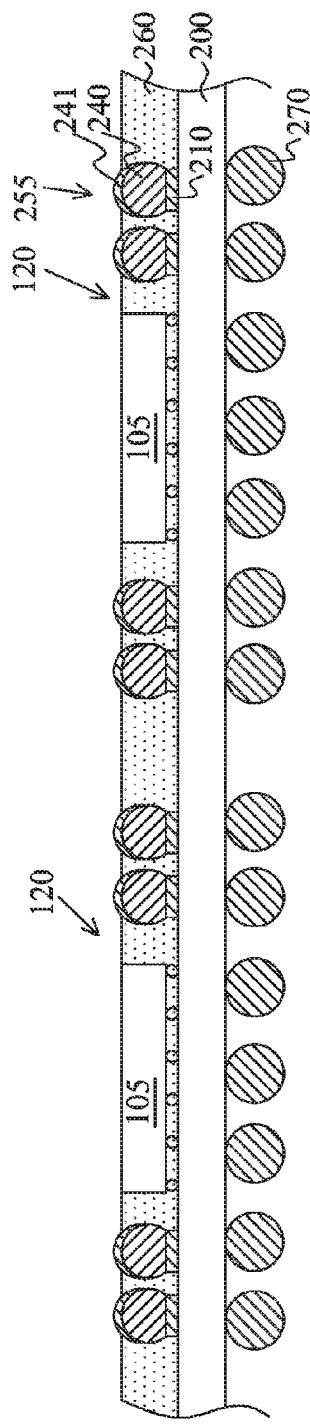

As described above, interconnect structures 205 include one or more layers of metal lines 204 and vias 206. The metal lines 204 and vias 206 are formed of copper or copper alloys, in accordance with some embodiments. Interconnect structures 205 are surrounded and insulated by inter-layer dielectrics (ILDs) (or inter-metal dielectrics, IMDs), which may be made of undoped silicon glass, doped film, low dielectric constant (low-k) dielectric, polymers, polymers with fillings, or combinations thereof. The dielectric polymers may include materials such as polyimide, polybenzoxazole (PBO), or benzocyclobutene (BCB). Fillings, such as silica fibers may be added to the polymers to increase the strength of the polymers. The ILDs may comprise one or more layers. In some embodiments, one or more passivation layers surround contact pads 210. The one or more passivation layers are made of polymers, such as polyimide, PBO, or BCB, which absorb stress exerted on contact pads 210 and substrate 200 during bonding process. Similarly, one or more passivation layers may also surround contact pads 207 for the purposed described above. After the molding compound 260 is formed, connectors 270 are bonded to contact pads (207) on the other side (opposite from packages 110) of substrate 200, as shown in FIG. 2F in accordance with some embodiments. Connectors 270 are made of conductive materials. They could be solder, solder alloy, copper, copper alloy, gold, or gold alloy, etc. As mentioned above, there could be a bonding layer (not shown) covering conductive pads (207). The connectors 270 are bonded to the conductive pads 207 by a reflow process. In some embodiments, connectors 270 are ball grid array (BGA) balls. Die package 120 is considered formed after molding compound 260 is formed or after connectors 270 are attached.

Figure 2G:
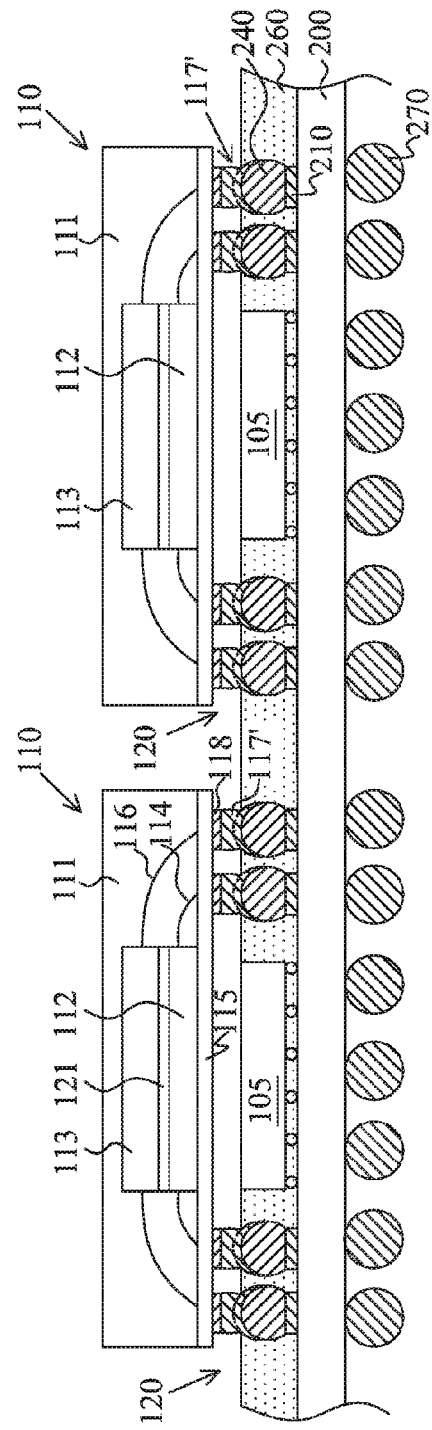

After connectors 270 are formed, die packages 110 are bonded to die packages 120, as shown in FIG. 2G in accordance with some embodiments. Afterwards, packages 110 are placed above substrate 200 and are mounted on metal balls 240, as shown in FIG. 2G in accordance with some embodiments. Each package 110 includes a two semiconductor dies 112 and 113, with die 113 disposed over die 112, in accordance with some embodiments. However, package 110 could include one semiconductor die or more than two semiconductor dies. In some embodiments, there is a glue layer 121 between dies 112 and 113. Semiconductor dies 112 and 113 may include various microelectronic elements, as described above for semiconductor dies 105. The examples of these various microelectronic elements have been described above. Semiconductor die 112 is bonded to a substrate 115. Substrate 115 may include various materials and/or components described above for the substrate of semiconductor die 105. Semiconductor die 112 is electrically connected to conductive elements (not shown) in substrate 115 via bonding wires 114, in accordance with some embodiments. Similarly, semiconductor die 113 is electrically connected to the conductive elements in substrate 115 via bonding wires 116. Package 110 also includes a molding compound 111, which covers semiconductor dies 112 and 113, and also bonding wires 114 and 116.

Each package 110 includes a number of connectors 117, which becomes 117' after bonding, surrounding semiconductor die 105, in accordance with some embodiments. Connectors 117 are made of a conductive material, such as solder, solder alloy, etc., in accordance with some embodiments. Connectors 117 are formed on contact pads 118 on the surface of substrate 115 to electrically connect to elements in substrate 115. After package 110 is placed over substrate 200 with connectors 117 of package 110 in contact with solder paste layer 241 over metal balls 240, a reflow process is performed to bond the connectors 117 to the solder past layer 241, which is bonded to metal balls 240, to form solder layer 117' in accordance with some embodiments. If the connectors 117 are made of solder or have a solder layer at the ends that come in contact with solder paste layer 241, the two solder layers would merge into one under reflow to form strong bonding structures 265, as shown in FIG. 4B in accordance with some embodiments.

Figure 4B:
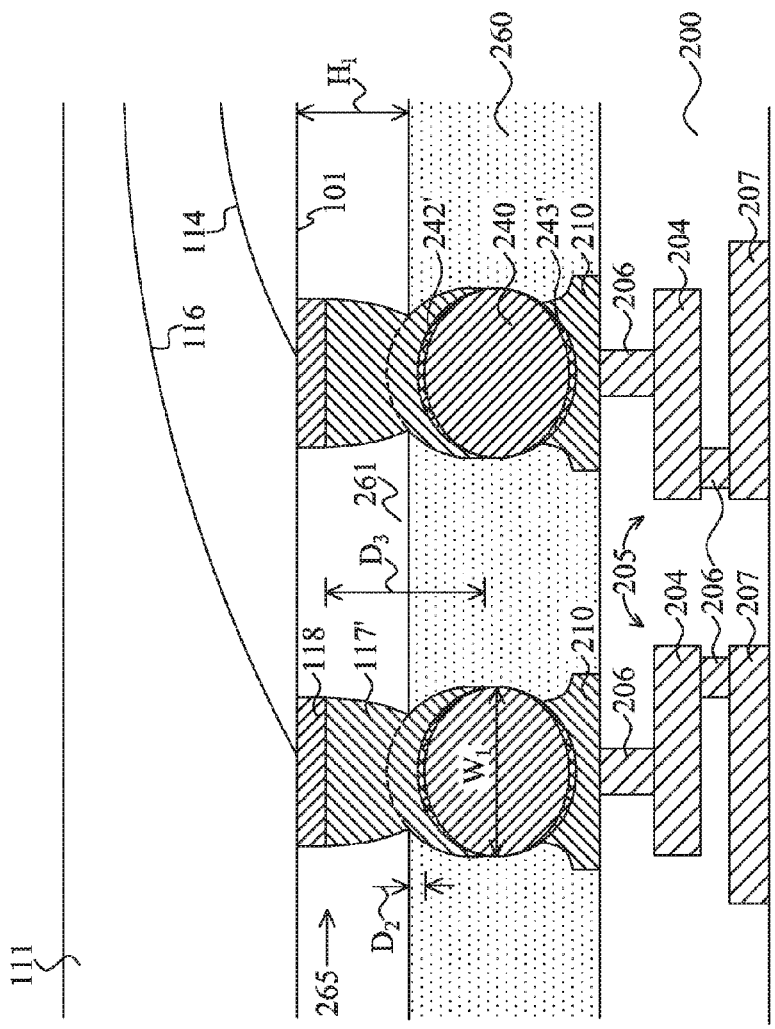
FIG. 4B is a cross-sectional view of an enlarged region of FIG. 2G, in accordance with some embodiments.

FIG. 4B shows region 250 of after die package 110 is bonded to package 120, in accordance with some embodiments. FIG. 4B show that the bonding structure 265 includes contact pad 118 and bonded solder layer 117', which is formed by merging connector 117 and solder paste layer 241. Bonding structure 265 also includes metal ball 240 and contact pad 210. As shown in FIG. 4B, there are IMC layer 242' between solder layer 117' and metal ball 240, and IMC layer 243' between metal ball 240 and contact pad 210, in accordance with some embodiments. The solder to solder bonding of bonded solder layer 117' is stronger than bonding between solder and copper, or solder and copper oxide. In addition, the bonding structure 265 does not have an interfacial copper oxide layer. Further, the bonded solder layer 117' and the IMC layer 142' extend below the surface 261 of molding compound 260, instead on at the same level of or higher than surface 261. As a result, the bonding structure 265 is stronger than a bonding structure with bonding interface next to or higher than surface 261. In some embodiments, the total solder height D3 is in a range from about 80 μm to about 130 μm. In some embodiments, the height H1 between a surface 261 of molding compound 260 and the bottom surface 101 of package 110 (or substrate 115) is in a range from 30 μm to about 80 μm.

The IMC layer 242' is thicker than IMC layer 242 of FIG. 4A, in some embodiments, due to additional thermal cycle(s) to form bonding structures 265. In some embodiments, the thickness of IMC layer 242' is in a range from about 2 μm to about 5 μm. In some embodiments, the thickness of IMC layer 243' is in a range from about 3 μm to about 8 μm.

Figure 5:
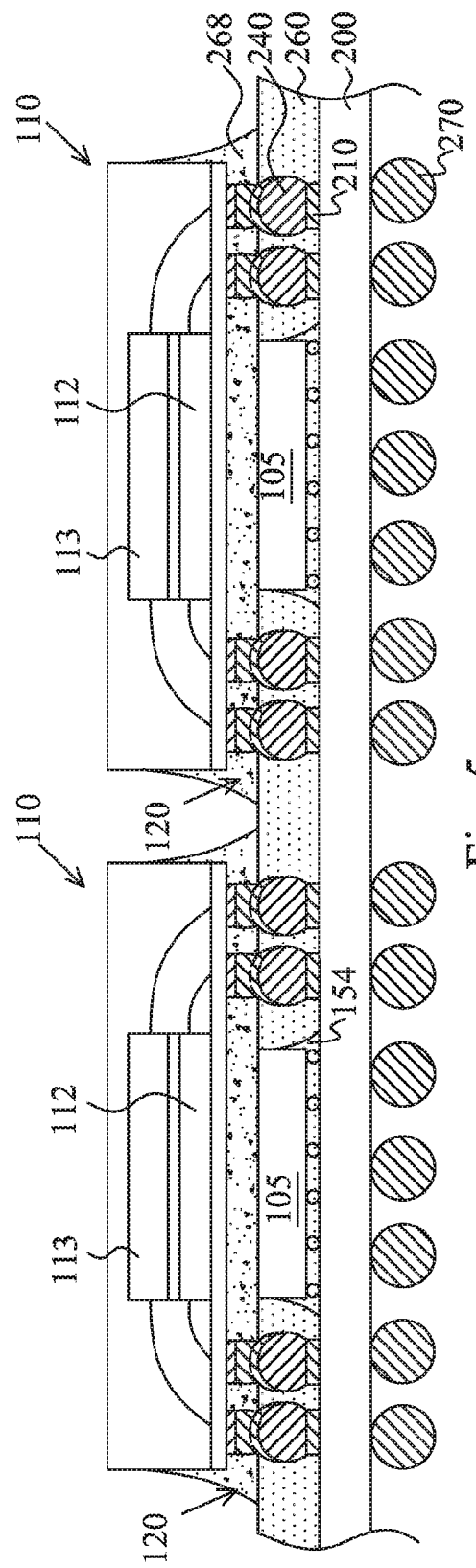
FIG. 5 shows a semiconductor die bonded to a die package with an underfill, in accordance with some embodiments.

After die packages 110 are bonded to die package 120, a molding compound 267 is formed to cover the space between and under die packages 110, as shown in FIG. 2H in accordance with some embodiments. The materials and forming methods of molding compound 267 have been described above. Molding compound 267 protects the bonding structures 265. As mentioned above, the molding compound 267 is made of a molded underfill (MUF) material and fills the space under packages 110 (or between packages 110 and 120). In some embodiments, an underfill 268 is formed to fill the space between packages 110 and 120, as shown in FIG. 5 in accordance with some embodiments. Underfill 268 protects bonding structures 265. FIG. 5 shows that both underfill 154 and molding compound 260 are form around die 105.

As described above, molding compound 267 or underfill 268 may be formed to protect bonding structures 265. In some embodiments, no molding compound or underfill is formed to protect 265. The package on package (PoP) structures, such as the structures of FIGS. 2G, 2H or 5, then undergoes a sawing process to singulate the PoP structures into individual PoP devices. FIG. 21 shows a PoP device (or structure) 150 after the sawing (or singulation) process, in accordance with some embodiments. FIG. 21 shows that die package 110 has an underfill 268. As described above, die package 110 could be covered by a molding compound, such as molding compound 267 of FIG. 2H, or could be without either one.

The described embodiments of mechanisms of forming a die package and package on package (PoP) structure involve forming a solder paste layer over metal balls of external connectors of a die package. The solder paste layer protects the metal balls from oxidation. In addition, the solder paste layer enables solder to solder bonding with another die package. Further, the solder paste layer moves an intermetallic compound (IMC) layer formed between the solder paste layer and the metal balls below a surface of a molding compound of the die package. Having the IMC layer below the surface strengthens the bonding structure between the two die packages.

In some embodiments, a die package is provided. The die package includes a semiconductor die, and at least a portion of the semiconductor die is surrounded by a molding compound. The die package also includes a substrate with interconnect structures, and the semiconductor die is bonded to the substrate and is electrically connected to the interconnect structures. The die package further includes a molding compound surrounding the semiconductor die, and molding compound covers a first portion of a surface of the substrate. The semiconductor die is bonded to a second portion of the surface. In addition, the die package includes an external connector surrounding the semiconductor die, and the external connector is electrically connected to the interconnect structures and to the semiconductor die. The external connector is embedded in the molding compound. The external connector includes a contact pad, and a metal ball. The metal ball is bonded to the contact pad. The external connector also includes a solder paste layer formed over a portion of metal ball, and a portion of the solder paste layer is exposed.

In some other embodiments, a package on package (PoP) structure is provided. The PoP structure includes a first die package having an first external connector surrounding a first semiconductor die, and the external connector is electrically connected to the first semiconductor die via interconnect structures in a substrate. Both the external connector and the first semiconductor die are disposed over the substrate and are embedded in a molding compound. The first external connector includes a contact pad and a metal ball. The metal ball is bonded to the contact pad. The first external connector also includes a solder paste layer formed over a portion of metal ball. A first portion of the solder paste layer is exposed, and a second portion of the solder paste layer is below a nearest surface of the molding compound. The PoP structure also includes a second die package having a second external connector, and the second external connector has a solder layer at one end. The solder layer of the second external connector is bonded to the solder paste layer of the first external connector.

In yet some other embodiments, a method of forming a die package is provided. The method includes forming a contact pad over a substrate, and the substrate includes interconnect structures. The method also includes bonding a metal ball to the contact pad, and applying a solder paste layer over a top end of the metal ball. The top end is furthest of the metal ball to the substrate, and the contact pad, the metal ball, and the solder paste layer forms a connection structure. The method further includes bonding a semiconductor die to the substrate, and forming a molding compound to fill a space between the semiconductor die and the connection structure. A portion of the solder paste layer is above a nearest surface of the molding compound and another portion of the solder past layer is below the nearest surface of the molding compound.

In some embodiments, a method of forming a package on package (PoP) structure includes forming a first die package, and bonding an external connector of a second die package to a solder paste layer of the first die package. The forming the first die package includes attaching a metal ball with a convex surface to a first contact pad on a substrate, and applying a solder paste layer over a distal end of the metal ball and leaving at least a portion of the metal ball without solder paste, where the distal end is a furthest end of the metal ball from the substrate. The forming the first die package also includes attaching a semiconductor die to the substrate, and forming a molding compound between the semiconductor die and the metal ball, where the solder paste layer has a first portion extending above an upper surface of the molding compound and a second portion extending below the upper surface of the molding compound.

In some other embodiments, a method of forming package on package (PoP) structure includes forming a first external connector on a substrate including bonding a metal ball with a convex surface to a first contact pad of the substrate, and depositing a solder past layer on an upper portion of the metal ball distal the substrate. The method also includes attaching a first semiconductor die to the substrate, where the first external connector and the first semiconductor die are electrically coupled to interconnect structures in the substrate, and forming a molding compound around the first external connector and the first semiconductor die. The method further includes attaching a second die package to the first external connector by forming a bonded solder layer between a second contact pad on the second die package and the metal ball, where the bonded solder layer contacts and extends below an upper surface of the molding compound distal the substrate, where the bonded solder layer has a first width measured at the upper surface of the molding compound and a second width measured between the upper surface of the molding compound and the substrate, with the first width being different from the second width.

In yet some other embodiments, a method of forming a package on package (PoP) structure includes forming a first die package, which includes attaching a semiconductor die to a first side of a substrate, attaching a metal ball with a convex surface to a first contact pad of the substrate, the first contact pad being on the first side of the substrate, and forming a molding compound over the first side of the substrate, the molding compound interposed between the semiconductor die and the metal ball, an upper surface of the molding compound extending further away from the substrate than an upper surface of the metal ball. The method further includes bonding a second die package having a second contact pad to the first die package via a bonded solder layer between the second contact pad of the second die package and the metal ball of the first die package, the bonded solder layer contacting and extending below the upper surface of the molding compound, the bonded solder layer having a first width at the upper surface of the molding compound and a second width below the upper surface of the molding compound, the second width continuously increasing as the bonded solder layer extends further below the upper surface of the molding compound.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a package on package (PoP) structure comprising:
    forming a first die package, comprising:
        attaching a metal ball with a convex surface to a first contact pad on a substrate;
        applying a solder paste layer over a distal end of the metal ball and leaving at least a portion of the metal ball without solder paste, wherein the distal end is a furthest end of the metal ball from the substrate;
        attaching a semiconductor die to the substrate; and
        forming a molding compound between the semiconductor die and the metal ball, wherein the solder paste layer has a first portion extending above an upper surface of the molding compound and a second portion extending below the upper surface of the molding compound; and
    bonding an external connector of a second die package to the solder paste layer of the first die package.

2. The method of claim 1, wherein the solder paste layer has a first width at an interface between the solder paste layer and the molding compound, and a second width for the second portion of the solder paste layer, wherein the first width is smaller than the second width.

3. The method of claim 1, wherein the attaching the semiconductor die comprises performing a reflow process, wherein the reflow process modifies a profile of the solder paste layer disposed over the distal end of the metal ball.

4. The method of claim 1, further comprising forming an underfill before the forming of the molding compound, wherein the underfill fills a gap between the semiconductor die and the substrate.

5. The method of claim 1, wherein the forming of the molding compound comprises forming the molding compound using a molded underfill (MUF), wherein the MUF fills a gap between the semiconductor die and the substrate.

6. The method of claim 1, wherein the upper surface of the molding compound extends further away from the substrate than the metal ball.

7. The method of claim 6, wherein a distance between a top surface of the metal ball and the upper surface of the molding compound is between about 150 µm to about 200 µm.

8. The method of claim 1, further comprising forming a first intermetallic compound (IMC) layer between the solder paste layer and the metal ball, the first IMC layer having a thickness in a range from about 2 µm to about 5 µm.

9. The method of claim 8, further comprising forming a second IMC layer between the metal ball and the first contact pad, the second IMC layer having a thickness in a range from about 3 µm to about 8 µm.

10. The method of claim 1, wherein the bonding of the external connector of the second die package to the solder paste layer of the first die package comprises performing a reflow process to merge a solder region of the external connector of the second die package with the solder paste layer of the first die package.

11. The method of claim 10, further comprising forming a bonding layer over the first contact pad prior to the attaching of the metal ball.

12. The method of claim 1, wherein a top surface of the solder paste layer is about 150 µm to about 200 µm above the upper surface of the molding compound.

13. A method of forming a package on package (PoP) structure comprising:
    forming a first external connector on a substrate, comprising:
        bonding a metal ball with a convex surface to a first contact pad of the substrate; and
        depositing a solder paste layer on an upper portion of the metal ball distal the substrate;

attaching a first semiconductor die to the substrate, wherein the first external connector and the first semiconductor die are electrically coupled to interconnect structures in the substrate;

forming a molding compound around the first external connector and the first semiconductor die; and attaching a second die package to the first external connector by forming a bonded solder layer between a second contact pad on the second die package and the metal ball, wherein the bonded solder layer extends below an upper surface of the molding compound distal the substrate, wherein the bonded solder layer has a first portion between the second die package and the upper surface of the molding compound and a second portion between the upper surface of the molding compound and the substrate, wherein a width of the second portion of the bonded solder layer increases monotonically from the upper surface of the molding compound to a lower portion of the second portion closest to the substrate.

14. The method of claim 13, wherein the upper surface of the molding compound extends further away from the substrate than a top surface of the metal ball distal the substrate.

15. The method of claim 13, further comprising forming a second external connector comprising solder or solder alloy on the second contact pad before the attaching the second die package.

16. The method of claim 13, wherein the solder paste layer has a first portion above the upper surface of the molding compound, and has a second portion under the upper surface of the molding compound.

17. A method of forming a package on package (PoP) structure comprising:
forming a first die package, comprising:
attaching a semiconductor die to a first side of a substrate;

attaching a metal ball with a convex surface to a first contact pad of the substrate, the first contact pad being on the first side of the substrate; and forming a molding compound over the first side of the substrate, the molding compound interposed between the semiconductor die and the metal ball, an upper surface of the molding compound extending further away from the substrate than an upper surface of the metal ball; and bonding a second die package having a second contact pad to the first die package via a bonded solder layer between the second contact pad of the second die package and the metal ball of the first die package, the bonded solder layer contacting the molding compound and extending below the upper surface of the molding compound, the bonded solder layer having a first width at the upper surface of the molding compound and a second width below the upper surface of the molding compound, the second width continuously increasing from the upper surface of the molding compound to a lowest portion of the bonded solder layer disposed under the upper surface of the molding compound.

18. The method of claim 17, further comprising forming a bonding layer on the first contact pad before the attaching the metal ball.

19. The method of claim 17, wherein the bonding of the second die package comprises performing a reflow process, the reflow process merging a solder region of an external connector of the second die package with a solder paste layer of the first die package.

20. The method of claim 17, wherein the forming of the first die package further comprises forming a solder paste layer over the metal ball, wherein a first portion of the solder paste layer extends above the upper surface of the molding compound, and a second portion of the solder paste layer extends below the upper surface of the molding compound.

* * * * *